(12) United States Patent
Chu et al.

(10) Patent No.: US 6,901,546 B2
(45) Date of Patent: May 31, 2005

(54) ENHANCED DEBUG SCHEME FOR LBIST

(75) Inventors: Sam Gat-Shang Chu, Austin, TX (US); Joachim Gerhard Clabes, Austin, TX (US); Michael Normand Goulet, Austin, TX (US); Johnny J. Leblanc, Austin, TX (US); James Douglas Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 09/876,753

(22) Filed: Jun. 7, 2001

(65) Prior Publication Data

US 2002/0188903 A1 Dec. 12, 2002

(51) Int. Cl.[7] .................. G01R 31/28; G06R 11/00
(52) U.S. Cl. .................. 714/738; 714/726; 714/729
(58) Field of Search .................. 714/716, 720, 714/724, 728, 732, 733, 738, 739, 744, 699

(56) References Cited

U.S. PATENT DOCUMENTS

| | | | | |
|---|---|---|---|---|
| 4,779,273 A | * | 10/1988 | Beucler et al. | 714/732 |
| 5,574,733 A | * | 11/1996 | Kim | 714/728 |
| 5,991,909 A | * | 11/1999 | Rajski et al. | 714/729 |
| 6,021,514 A | * | 2/2000 | Koprowski | 714/733 |
| 6,125,465 A | | 9/2000 | McNamara et al. | 714/733 |
| 6,516,432 B1 | * | 2/2003 | Motika et al. | 714/732 |
| 2002/0073373 A1 | * | 6/2002 | Nakao et al. | 714/738 |

* cited by examiner

Primary Examiner—Greg J Lamarre
Assistant Examiner—John J. Tabone, Jr.
(74) Attorney, Agent, or Firm—Louis J. Percello; F. Chau & Associates, LLC

(57) ABSTRACT

A device for fault testing in a microprocessor chip provides a LBIST circuit which has a first reference signature. A loading unit is further provided for receiving and outputting a set of masking data. A file unit connected to the loading unit is yet further provided for receiving the masking data. A masking unit connected to the file unit is yet further provided for generating a second reference signature based on the masking data from the file unit and a scanning data from a scan string in the chip. And, a signature logic connected to the output of the masking unit is yet further provided for compressing the second reference signature and inputting the compressed second reference signature to the LBIST circuit, wherein the compressed second reference signature replaces the first reference signature.

18 Claims, 7 Drawing Sheets

ENHANCED DEBUG SCHEME FOR LBIST

BACKGROUND OF THE INVENTION

1. Field of the Invention

The present invention relates to a circuit and more particularly to an enhanced debug circuit for (Logic Built-In Self Test) LBIST testing.

2. Description of the Related Art

LBIST has been extensively used within IBM for testing of faults in chips. Published materials about LBIST include E. B. Eichelbergr and E. Lindbloom, "Random-Pattern Coverage Enhancement and Disgnosis for LSSD Logic Self-Test," *IBM J. Research and Development*, Vol. 27, No. 3, May 1983, pp. 265–272; T. W. Williams and E. B. Eichelberger, "Random Patterns Within a Structured Sequential Logic Design," *Digest of Papers 1977 Semiconductor Test Symp, IEEE*, October 1977, pp. 19–26; P. Bardell and W. McAnney, "Self-Testing of Multichip Logic Modules," *Digest of Papers* 1982, pp. 200–204; D. Komonytsky, "LSI Self-Test Using Level Sensitive Scan Design and Signature Analysis," *Degest of Papers 1982 Int'l Test Conf. IEEE*, November 1982, pp. 414–424; E. B. Eichelberger and T. Williams, "A logic Design Structure for LSI Testability," *J. Design Automation and Fault Tolerant Computing*, Vol. 2, No. 2, May 1978, pp. 165–178; and F. Motika, et al., "An LSSD Pseudo Random Pattern Test System," *Int'l TestConf.* 1983 *Proc. IEEE*., October 1983, pp. 283–288. The above-mentioned publications are incorporated herein by reference.

To try to ensure that microprocessor chips have no hidden defects, chips are tested using LBIST, whereby all the logic on the microprocessor chip is tested using a large number of patterns to ensure a high test coverage. Typically, after each pattern, the resultant data in each "string" of latches are combined to form one "signature" which depends on values of all the individual latch bits. This signature is updated after each test, so that in the end, the final signature depends on the values of all the latch bits, as determined after all tests. The correct signature can be determined by simply running the tests at low frequency, where everything is sure to pass the test. The test signature generated from this low frequency testing will be referred as "the golden signature." This golden signature is then used to compare against signatures obtained as the test frequency is increased. In this way, tens, or hundreds of thousands (or millions) of patterns can be used in the tests, since there is only one compare step, at the end of the process, and the business of calculating the signatures is done on the fly, as each test is completed. Although the chip will usually be divided up into many scan "strings," each of which has its own signature, and each of which can be tested separately, it can be seen that, in any given string, as soon as a single latch fails, the signature will be altered.

Since the signature doesn't include any detailed information about which latch failed during which pattern, further debugging beyond this point becomes very difficult. For example, given the knowledge that latch "A" fails first as the testing frequency is ramped up, it would be very useful to be able to find out at what frequency the next failure occurs (say latch "B" in the same string). However, as soon as latch "A" starts failing, the signature no longer matches the golden signature, and, as the test frequency is raised, there is no way to identify when other latches start to fail. There is no way to determine a new "golden" signature which accounts for the failure in latch "A," since the failure may occur on many of the test patterns, and as the frequency is changed, the number of "failures" changes in an unpredictable way, meaning that the signature changes unpredictably as well. This is a source of the problem for fault testing in LBIST.

Hence, it is desirable to provide an enhanced debug circuit which can provide a method and apparatus for screening out failures and obtaining a new signature, such that the test can be continued to higher frequencies.

SUMMARY OF THE INVENTION

The present invention provides an enhanced debug circuit for LBIST testing, and provides a method of screening out failures on a bit-by-bit basis, so that a new signature can be obtained, and the test can be continued to higher frequencies. The present invention can determine and identify exactly which timing paths on the chip fail at which frequencies and map out the whole pattern of failures up to an arbitrary frequency, without being stopped at wherever the first failure occurs on the given string. The present invention can also target a specific latch bit in a string, ignoring everything else, to find the worst case failing pattern ending in that latch.

The system of the present invention includes a test unit having a first reference signature representing faults at a first frequency, a loading unit for receiving and outputting masking data, and a masking unit coupled to the loading unit, the masking unit generating a second reference signature based on the masking data and scanning data from a scan string in the chip, wherein the second reference signature replaces the first reference signature such that the test unit represents faults at a second frequency.

The method for fault testing in the present invention comprises the steps of generating a first reference signature which represents faults at a first test frequency, testing the first reference signature with a target signature, identifying a failing pattern if the first reference signature is not equal to the target signature, masking the failing pattern based on masking data and scanning data from a scan string in the chip, and replacing the first reference signature by a second reference signature which represents a fault at a second test frequency.

These and other aspects, features and advantages of the present invention will become apparent from the following detailed description of illustrative embodiments thereof, which is to be read in connection with the accompanying drawings

BRIEF DESCRIPTION OF THE DRAWINGS

The above objects and advantages of the present invention will become more apparent by describing in detail embodiments thereof with reference to the attached drawings in which.

DESCRIPTION OF THE EMBODIMENTS

Figure 1A:
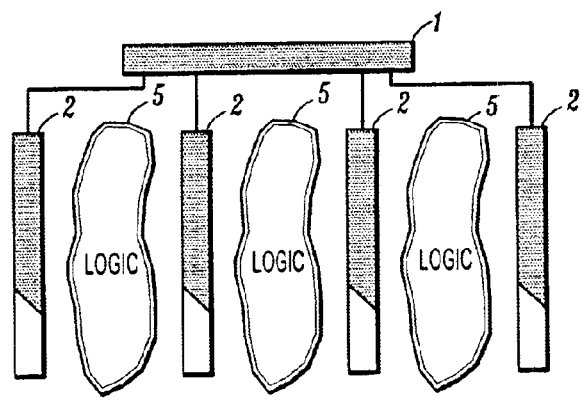
FIGS. 1A, 1B and 1C are schematic diagrams showing LBIST testing.

An enhanced debug circuit is provided for LBIST testing in that the failures are screened out on a bit-by-bit basis, and a new signature is obtained allowing the test to be continued to higher frequencies. The enhanced debug circuit determines and identifies the failures by locating the timing paths and frequencies and mapping out the failures up to an arbitrary frequency, without being stopped at the first failure.

Referring now in detail to the drawing in which like reference numerals identify similar or identical elements throughout the drawings.

Figure 1B:
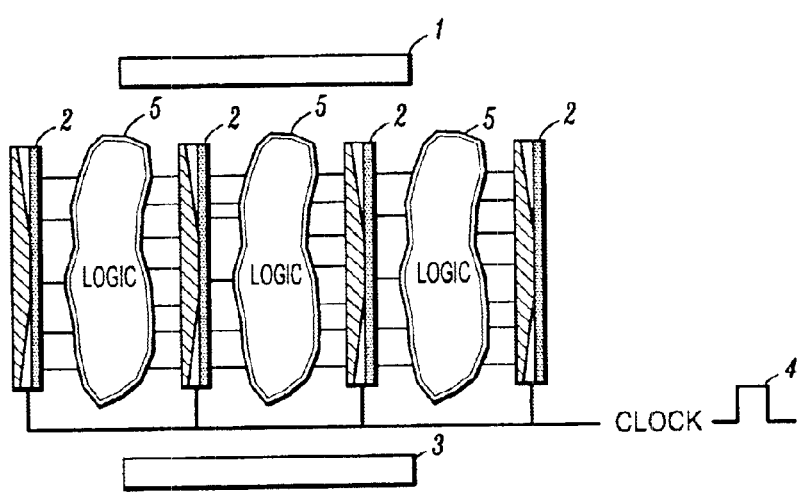
Figure 1C:
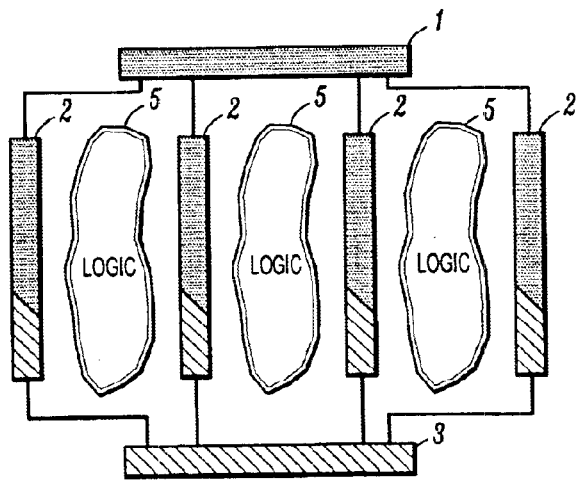

FIGS. 1A, 1B and 1C are schematic diagrams showing LBIST testing. Generally, the test can be started by providing a pattern generator 1, such as a Pseudo Random Pattern Generator (PRPG), for generating test patterns. The test patterns generated are then passed through parallel scan strings 2 to a signature compression register 3, such as a Multiple Input Shift Register (MIST). In FIG. 1A, test patterns generated from the pattern generator 1 are scanned and passed into scan strings 2. The test patterns are illustrated as black portions thereof. FIG. 1B shows that when the scan strings 2 are filled with the test patterns, with the pattern generator 1 and scan strings 2 temporarily disconnected, system clocks 4 are pulsed to capture the results of the test patterns through the logic 5. In FIG. 1C, the captured test results are scanned and passed into the signature compression register 3 where the captured test results are compressed to be a "signature." The captured test results are illustrated as cross-hatched portions thereof. Note that a new set of test patterns (not shown) is loaded simultaneously in for further processing. In FIG. 1B and FIG. 1C, the clocking and related test step can be processed repeatedly thousands to millions of times before the signature compression register 3 can obtain a signature, depending on the test converge requirements or test time limitations.

Figure 2:
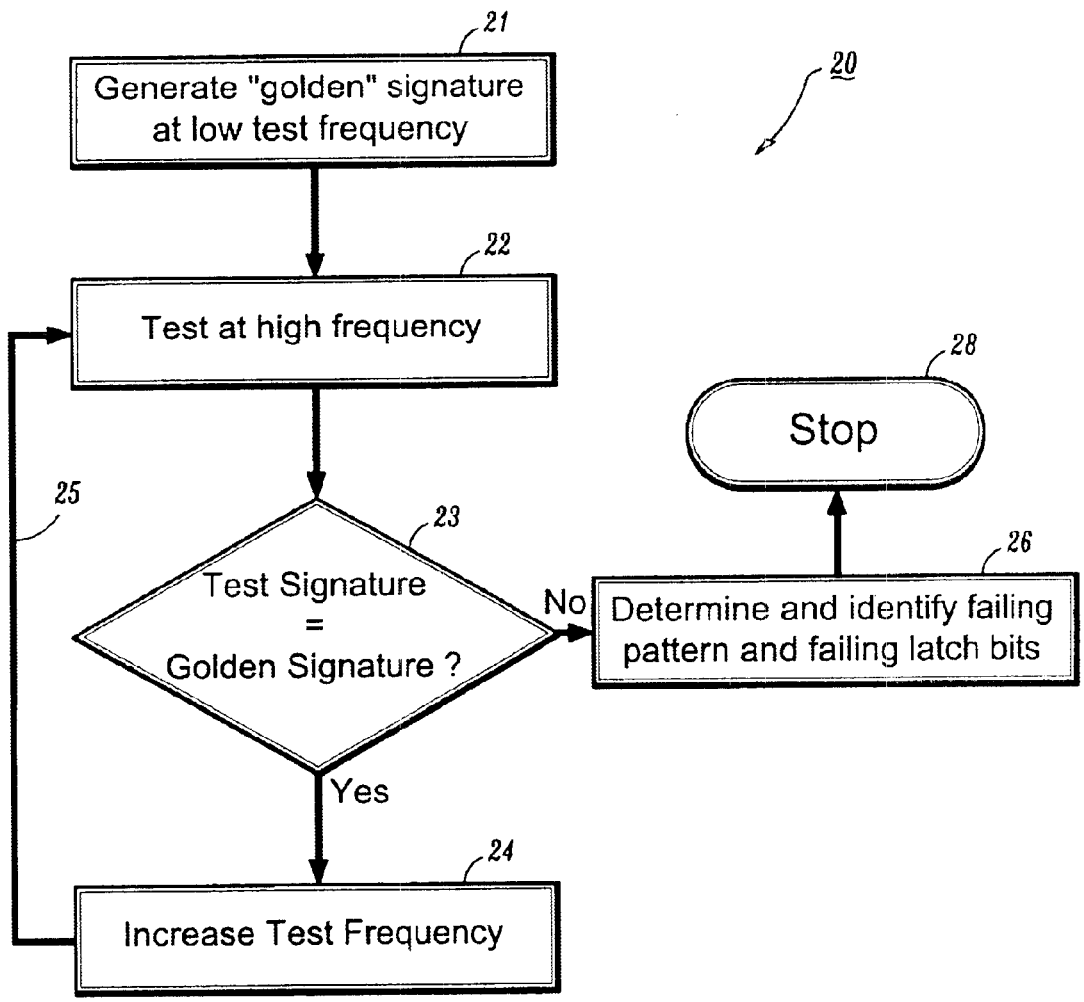
FIG. 2 is a flowchart illustrating a testing operation for a LBIST.

FIG. 2 is a flowchart illustrating a testing operation 20 in a LBIST. In this operation, the desired set of test patterns is first run in step 21 at low frequency, where no fails are expected to occur. The test signature generated from this low frequency test will be referred as "the golden signature," and it will be used as a basis for comparison during high frequency test to determine when a failure occurs. After generating the golden signature, testing starts in step 22 at high frequency, e.g., from 100 MHz to 3 GHz, depending on the type of microprocessor being tested. In every test, the resulting signature is compared with the golden signature. In step 23, if the two signatures match, the chip "passes" the test and goes to step 24. In step 24, the frequency is further increased and the test is carried out again in a feedback loop 25 to step 22. In this way, testing proceeds until a frequency is found at which the chip "fails," and the signature no longer matches the golden signature.

Figure 3:
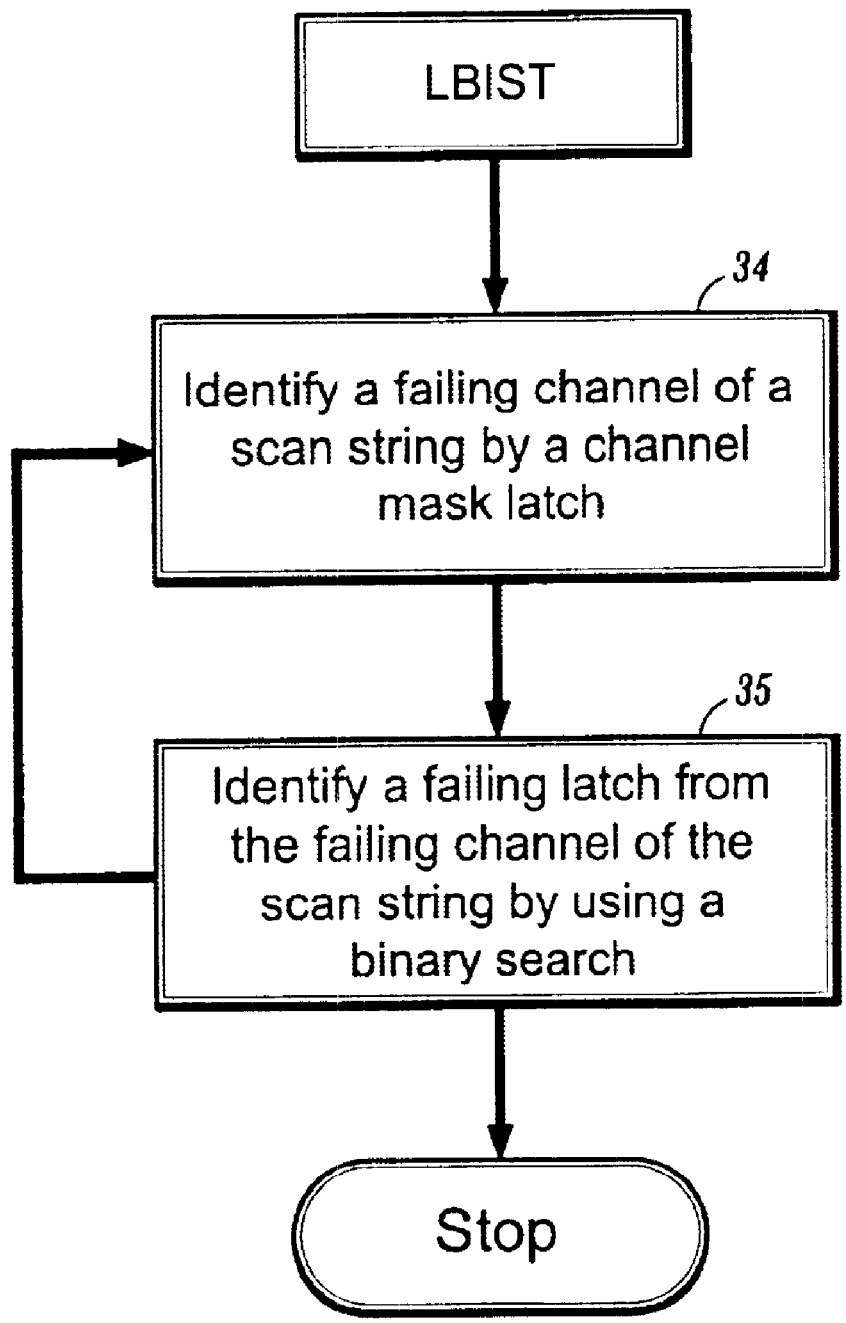
FIG. 3 is a flowchart illustrating a LBIST two-step analysis for failure identification.

Generally, at higher frequencies, the signature will change unpredictably, and a test will more likely "fail." Referring to step 23 again, if the two signatures do not match, the chip does not "pass" the test. The test then goes to step 26 to identify failure(s) and determines the failing latch(es) by using a LBIST analysis technique. For example, a two-step analysis may be employed. FIG. 3 shows a flowchart of a LBIST two-step analysis for failure identification, which includes the following.

Figure 4:
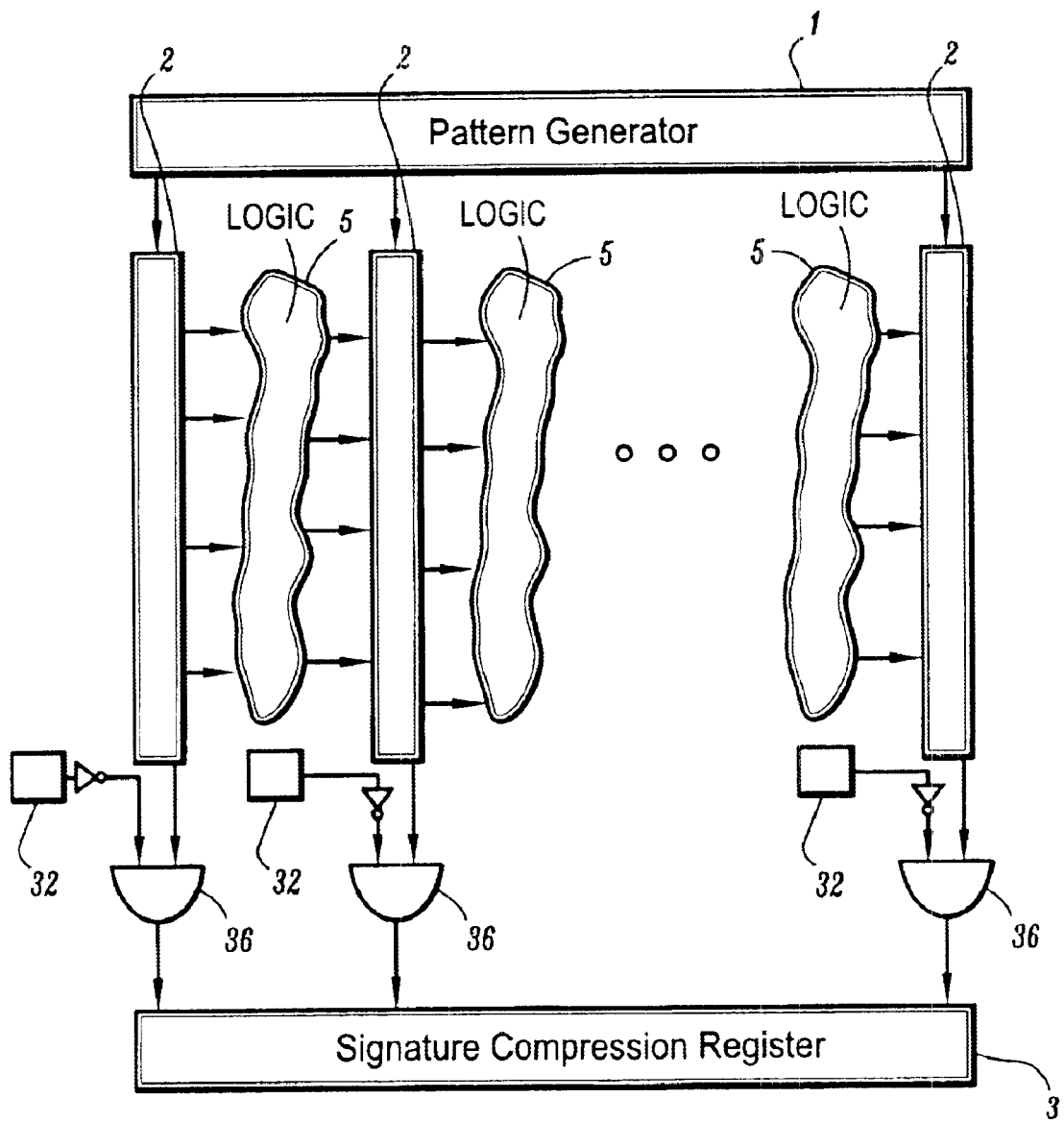
FIG. 4 is a block diagram showing a LBIST with channel mask latches and combining units added for determining and identifying failing patterns.

In step 34, the scan string channel(s) which include the failing latch(es) are determined by masking all but one of the scan string channels using the channel mask latches based on a golden signature generated for each channel. Step 34 may be repeated for each channel to determine the failing channel(s). Step 34 is further illustrated in detail with reference to FIG. 4, which is a block diagram including the same configuration as in FIG. 1 with channel mask latches 32 and combining units 36 added for determining and identifying failing patterns. In FIG. 4, the channel mask latches 32 can be set forth as '0' for string values contributing to the "signature" and '1' for blocked string values. When the output of channel mask latches 32 and output of scan strings are ANDed into the combining unit 36, the string channel 2 which includes the failing latch(es) can be determined because all non-failing channels have been masked out while the failing string channel is blocked from the masking out for identification.

Next, after the failing channel(s) has been identified, the step 34 moves to step 35. In step 35, the failing latch within the channel is identified by finding the failing LBIST cycle. A "binary search" is provided in step 35 for finding a failing signature within a reduced cycle by applying a golden signature for these binary cycle values. Thus, a failing signature which can normally be located after n cycles, can be located after n/2 cycles by using the binary search. The binary search starts by first generating a new golden signature for the first n/2 cycles, instead of for the full number (n) of cycles. The test is then repeated at the failing frequency with only the first n/2 cycles to see if a failing signature is obtained. If a failing signature is obtained, then a failing cycle exists between cycle 1 and cycle n/2. If not, then a failing cycle exists between cycle n/2 and cycle n. Next, cycles 1 through n/4 or cycles n/2 through 3n/4 will be tested, depending on whether a failing signature was found in the first test. The outcome of this test will again narrow the search space by removing half of the cycles from consideration. The binary search will continue running tests in a repeated manner until the failing cycle is reached. By unloading the failing scan string channel after reaching the failing cycle and comparing the failing values with the non-failing values, the failing latch is determined.

Referring again to FIG. 2, although the failing latch bits are determined in step 26, all the data is dumped and testing comes to an end in step 28.

Figure 5:
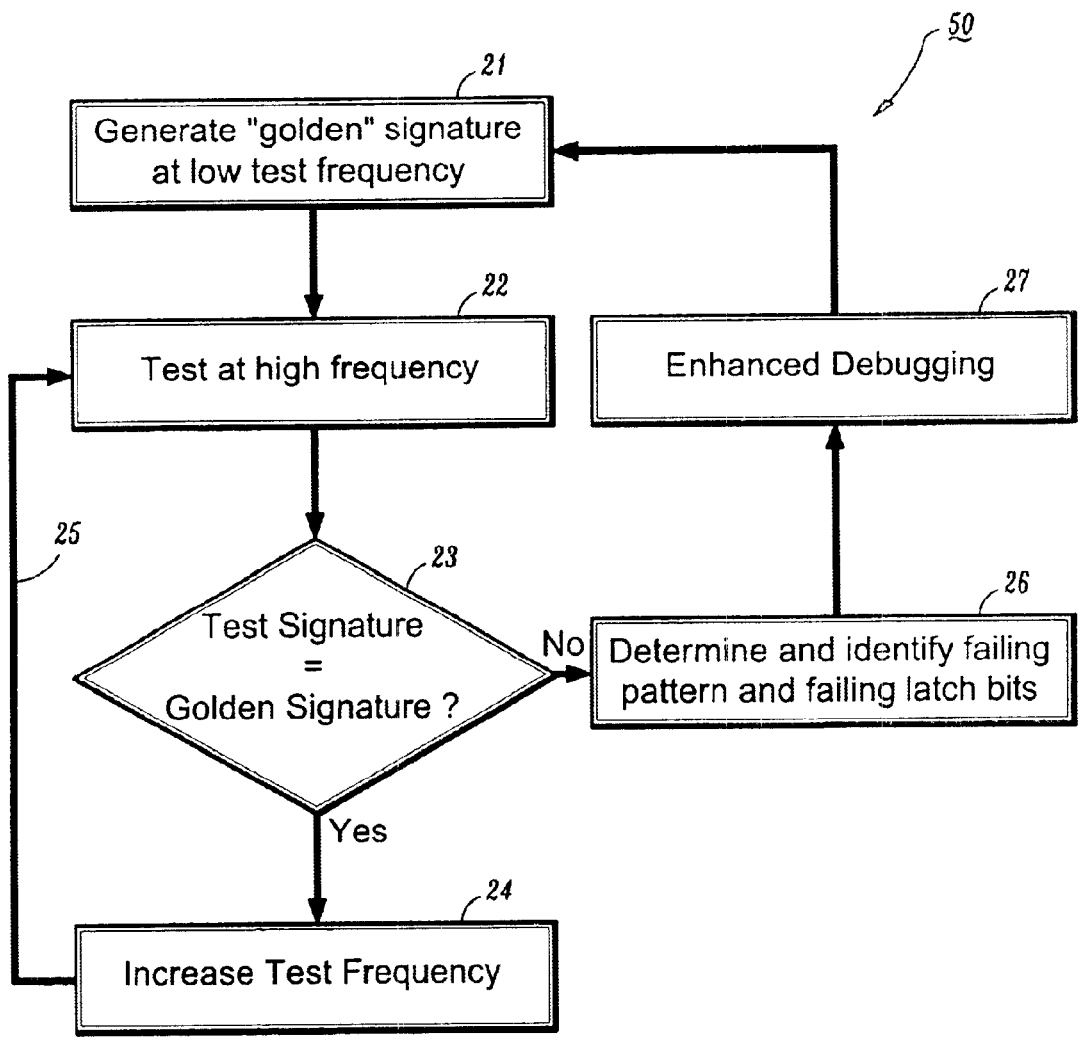
FIG. 5 is a flowchart of a LBIST including an enhanced debugging step.

To continue the testing, a testing operation 50 is provided as illustrated in FIG. 5, wherein an enhanced debugging step 27 is added. In step 27 of FIG. 5, the enhanced debugging step is conducted after determining and identifying failure in the test operation such that the test can be continued to find timing paths on the chip, which might fail at higher frequencies. An enhanced debug circuit for performing step 27 is described in detail in an embodiment shown in FIG. 6.

Figure 6:
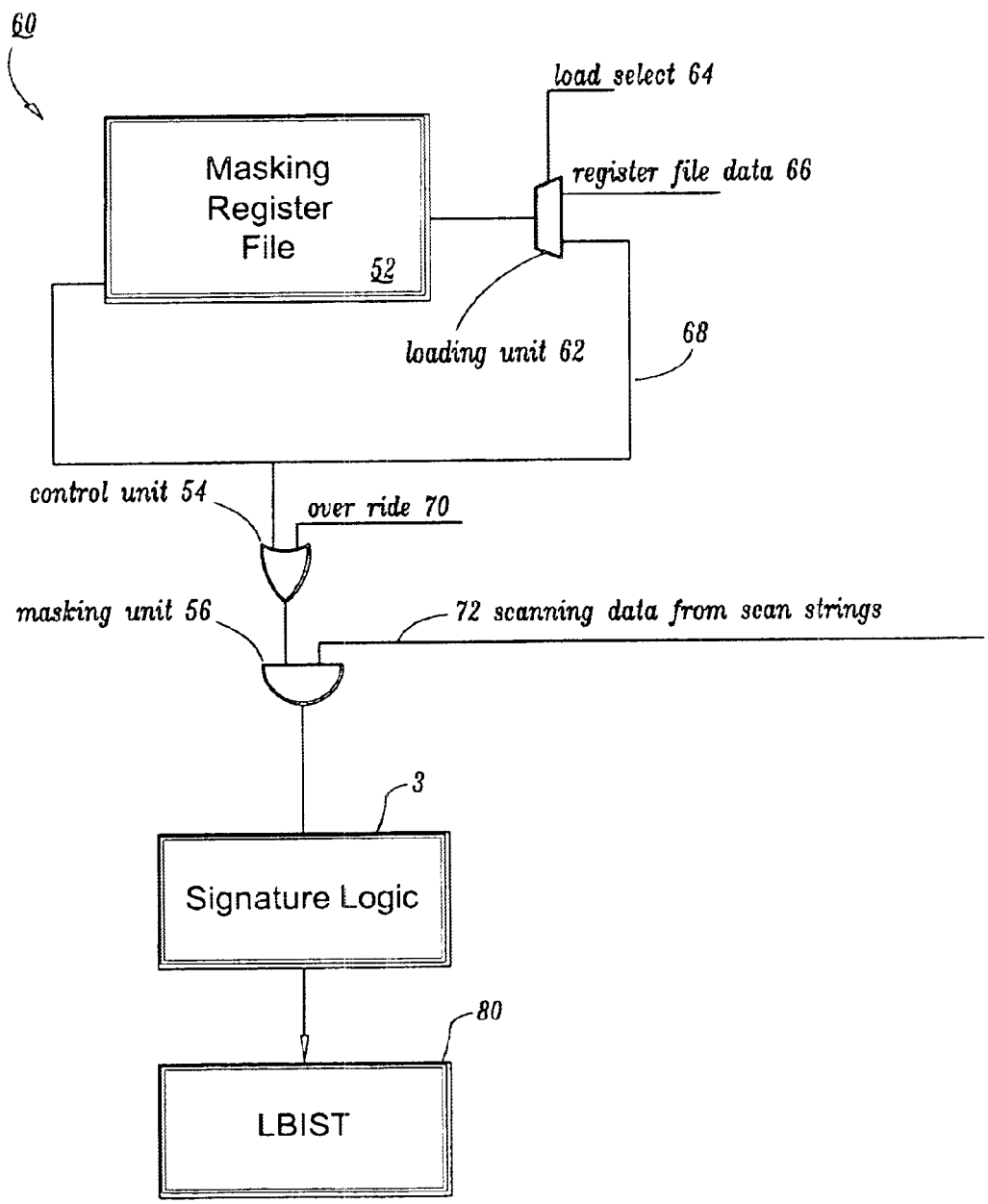
FIG. 6 is a block diagram showing an embodiment of the present invention where an enhanced debug circuit is provided for LBIST testing.

FIG. 6 shows an embodiment of the present invention where an enhanced debug circuit 60 is provided for LBIST testing. FIG. 6 represents an enhanced debug circuit. In the debug circuit 60, a masking register file 52, which can be a scan-only register file, is provided for masking operation. A control unit 54, which can be an OR gate, is further provided to allow overriding or disabling the action of the masking register file 52 by setting forth an "over ride" signal 70. A masking unit 56, which can be an AND gate, is yet further provided to combine the scanning data 72 with the output from the masking register file 52. A loading unit 62, which can be a 2:1 multiplexor (mux), is further provided to allow either recycling the data from the register file 52 back to the loading unit 62 via a feedback loop 68 during test, or loading new register file data 66 prior to testing. A load select 64 is provided to determine the selection between the recycling data from feedback loop 68 and new register file data 66. A signature compression register 3 is yet further provided to compress the output from the masking unit 56 to generate new signature data and further send the signature data to a LBIST unit 80.

Figure 7:
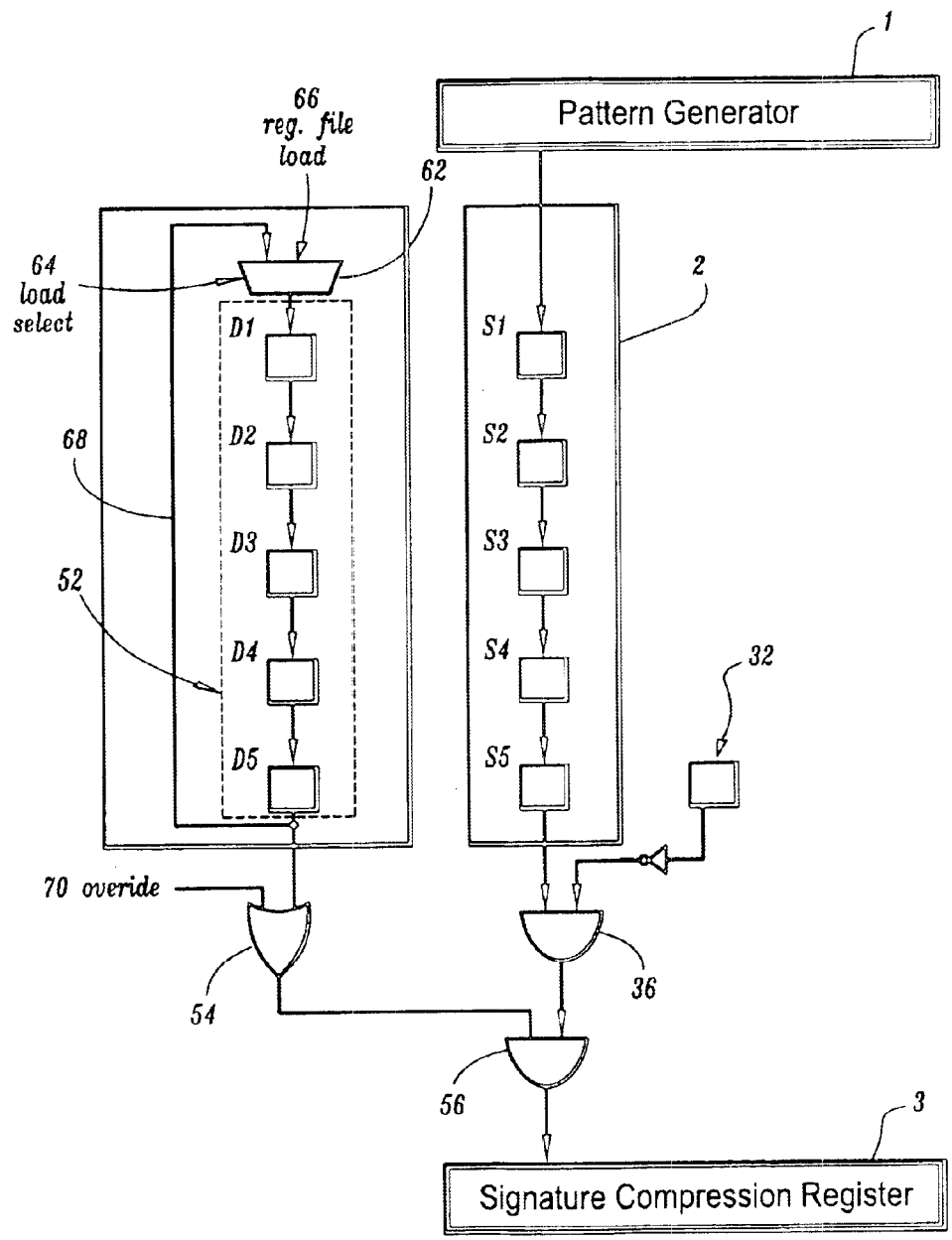
FIG. 7 is a block diagram of the bit-by-bit testing between a masking register file and a scan string.

FIG. 7 shows a block diagram of bit-by-bit testing between a masking register file 52 and scan string 2. The masking register file 52 can be a serial string of latches, e.g., D1, D2, D3, D4, and D5, being at least as long as the longest scan string 2 on the chip, which includes its string of latches, e.g., S1, S2, S3, S4 and S5. The masking register file 52 receives the same sequence of scan clocks (not shown) as does the scan string 2, so that data in the masking register file 52 shifts bit-by-bit along with the serial data in the scan string 2. The "first" latch in the masking register file 52, e.g., D1, matches the first latch, e.g., S1, in the scan string 2. This continues correspondingly with each latch in the scan string 2 having a matching latch in the masking register file 52.

During testing, the masking register file 52 can be loaded with, for example, all "1s" except for the positions which match the positions of the failing latches in the same string. In this example, these positions are set to "0." When the results of the testing are later read into the signature compression register 3, each bit from the scan string is ANDed by a masking unit 56 with the corresponding bit from the masking register file 52. In this example, the result of this AND operation is always "0" when the corresponding bit stored in the masking register file 52 is "0" (independent of the actual value coming from the scan string 2). In this way, all the failing bits are always set to a known, constant value, and they are effectively masked out from all future testing. Therefore, after loading the masking register file 52 with the appropriate patterns, a new "golden signature" is obtained at low frequency, and the testing can now continue above the frequency where the previous failure was observed. During testing, the outputting data of the masking register file 52 is cycled back via a feedback loop 68 to the input of the loading unit 62, so that it doesn't have to be reloaded after each test. This procedure of testing, masking, then re-testing can be continued to any arbitrary frequency up to the limit of the testing apparatus (e.g., from 100 MHz to 3 GHz, depending on the application), to map out the whole pattern of failures for any scan chain on the chip.

It is also possible to use the present invention to focus on single latch bits (or single groups of latches). The masking register file 52 can be loaded from the beginning with "0" in every position except for the position(s) corresponding to the latch(s) of interest. Testing the latches of interest proceeds in the normal fashion, but the only results that are observed are those from the specific latches chosen.

Finally, the over ride signal 70 in the control unit 54 can be used for testing in situations where the masking register file 52 is not needed, or to provide additional flexibility during test sequences. For example, with the over ride signal 70 ON (masking register file 52 disabled), initial testing can be done without having to first load the masking register file 52 with all "1s". Further, the over ride signal 70 is also useful in situations where a latch, or group of latches is known to fail on all chips at a reduced frequency. Furthermore, the masking register fife 52 can be loaded appropriately at the beginning of the testing. A test is first carried out with the over ride signal 70 ON (masking register file 52 disabled), to find the failing frequency of the "problem" latches. Then, the control unit 54 is turned OFF (masking register file 52 enabled) to find the worst failing frequency of the rest of the scan string. Thus, the whole test sequence can be easily set up from the beginning without having to stop and load the masking register file 52 half way through the process.

The embodiments of the present invention may include other components in addition to or instead of the components shown in the FIGS. For example, other types of logic may be employed as one skilled in the art would understand.

Having described preferred embodiments of an enhanced debug circuit for LBIST testing (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A device for fault testing in a microprocessor chip comprising:
   a test unit for receiving a first reference signature indicative of faults at a first frequency;
   a loading unit responsive to the test unit for receiving and outputting masking data; and
   a masking unit coupled to the loading unit, the masking unit generating a second reference signature responsive to the masking data and scanning data from a scan string in the chip, wherein the second reference signature replaces the first reference signature such that the test unit is responsive to faults at a second frequency.

2. The device for fault testing of claim 1 further comprising a masking register file connected between an output of the loading unit and an input of the masking unit, wherein the masking register file feeds back the masking data to the loading unit for saving a reloading time after the testing.

3. The device for fault testing of claim 2, wherein the masking register file further comprises multiple latches, wherein the number of latches of the masking register file is equal to or greater than the number of latches in the scan string on the chip.

4. The device for fault testing of claim 2, wherein the masking register file includes a scan-only register.

5. The device for fault testing of claim 2, wherein the masking register file performs an exclusive testing to a predetermined latch.

6. The device for fault testing of claim 5, wherein the latches of the masking register file shift bit-by-bit in synchronization with latches in the scan string, respectively, in response to a clock.

7. The device for fault testing of claim 2 further comprising a control unit connected between an output of the masking register file and the input of the masking unit, wherein the control unit controls the masking register file to withhold the masking data for saving a loading time during the testing.

8. The device for fault testing of claim 7, wherein the control unit is an OR gate.

9. The device for fault testing of claim 1, wherein the masking unit assigns a predetermined value to a failing latch in the scan string for identifying a location and a test frequency of the failing latch.

10. The device for fault testing of claim 1, wherein the masking unit is an AND gate.

11. The device for fault testing of claim 1, wherein the loading unit is a multiplexor.

12. A method for fault testing in a microprocessor chip comprising the steps of:
generating a first reference signature indicative of faults at a first test frequency;
testing the first reference signature with a target signature;
identifying a failing pattern if the first reference signature is not equal to the target signature;
masking the failing pattern based on masking data and scanning data from a scan string in the chip; and
replacing the first reference signature by a second reference signature responsive to a fault at a second test frequency.

13. The method for fault testing in a microprocessor chip of claim 12, wherein the step of masking the failing pattern further comprises the step of withholding the masking data for saving a loading time during the testing.

14. The method for fault testing in a microprocessor chip of claim 13, wherein the step of masking the failing pattern further comprises the step of shifting the masking data in synchronization with the scanning data bit-by-bit for matching the reference signature with the target signature.

15. The method for fault testing in a microprocessor chip of claim 13, wherein the step of masking the failing pattern further comprises the step of assigning a given value for a failing pattern for identifying a location and a test frequency of the failing pattern.

16. The method for fault testing in a microprocessor chip of claim 12, wherein the step of masking the failing pattern further comprises the step of feeding back the masking data to a loading unit for saving a reloading time after the testing.

17. The method for fault testing in a microprocessor chip of claim 12, wherein the step of masking the failing pattern comprises masking a predetermined latch for exclusively performing testing of scan data corresponding to said latch.

18. A method of determining a worst failing frequency for a first portion of a chip with a known latch failure pattern at a reduced failing frequency for a second portion of the chip, comprising the steps of:
loading a masking data set indicative of the known latch failure pattern;
overriding use of said masking data set for determining the reduced failing frequency of the second portion;
generating a first reference signature indicative of the second portion faults at the reduced failing frequency;
testing said first reference signature with a target signature;
identifying a failing pattern if the first reference signature is not equal to the target signature;
removing the override to allow use of said masking data set;
masking the failing pattern of the second portion based on said masking data set;
scanning data from a scan string in said chip indicative of a failure pattern in the first portion; and
replacing said first reference signature by a second reference signature responsive to a fault at the worst failing frequency.

* * * * *